(12) United States Patent
Yelluru

(10) Patent No.: US 7,193,877 B1
(45) Date of Patent: Mar. 20, 2007

(54) CONTENT ADDRESSABLE MEMORY WITH REDUCED TEST TIME

(75) Inventor: Sadashiva R. Yelluru, Santa Clara, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 11/256,066

(22) Filed: Oct. 21, 2005

Related U.S. Application Data

(60) Provisional application No. 60/723,833, filed on Oct. 4, 2005.

(51) Int. Cl.
   *G11C 15/04* (2006.01)
   *G11C 29/00* (2006.01)

(52) U.S. Cl. ............... 365/49; 365/201; 711/108

(58) Field of Classification Search ............ 365/49
   See application file for complete search history.

(56) References Cited

U.S. PATENT DOCUMENTS

| | | | |
|---|---|---|---|
| 6,418,042 B1 * | 7/2002 | Srinivasan et al. ........ | 365/49 |
| 6,539,455 B1 * | 3/2003 | Khanna et al. ........... | 711/108 |
| 6,564,289 B2 * | 5/2003 | Srinivasan et al. ....... | 711/108 |
| 6,609,222 B1 * | 8/2003 | Gupta et al. ............. | 714/733 |
| 6,934,795 B2 * | 8/2005 | Nataraj et al. ........... | 711/108 |
| 6,934,796 B1 * | 8/2005 | Pereira et al. ........... | 711/108 |
| 2004/0128441 A1 * | 7/2004 | Regev et al. ............. | 711/108 |

\* cited by examiner

*Primary Examiner*—Son L. Mai
(74) *Attorney, Agent, or Firm*—Shemwell Mahamedi LLP

(57) ABSTRACT

A CAM device having internal circuitry to reduce test time through parallel test setup and parallel pass/fail result generation. A plurality of match results is generated in parallel within a plurality of CAM blocks of the CAM device in response to a search instruction, each match result including a block flag signal that indicates whether a match was detected within a corresponding one of the CAM blocks and a block index that indicates a location of an entry within the one of the CAM blocks. The block index and block flag signal of a highest priority one of the match results is output from the CAM device if an operating mode value indicates a first operating mode, and the block flag signals of the plurality of match results is output from the CAM device if the operating mode value indicates a test operating mode.

23 Claims, 4 Drawing Sheets

CONTENT ADDRESSABLE MEMORY WITH REDUCED TEST TIME

CROSS-REFERENCE TO RELATED APPLICATIONS

This application claims priority from, and hereby incorporates by reference, U.S. Provisional Application No. 60/723,833, filed Oct. 4, 2005 and entitled "Content Addressable Memory with Reduced Test Time."

FIELD OF THE INVENTION

The present invention relates to integrated circuits, and more particularly to associative memory devices.

BACKGROUND

Content addressable memory (CAM) testing tends to be more time consuming than conventional memory testing due to the additional tests needed to confirm proper match and mismatch operation in each storage location. In typical single-bit mismatch testing, for example, each bit in each storage row of the CAM device is tested in a respective compare operation to confirm that inequality between search data and the bit under test will yield a row mismatch result and thus involves a number of compare operations according to the CAM density (i.e., number of CAM cells in the CAM device). Consequently, test times have escalated with CAM densities to the point of becoming a production bottleneck.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A CAM device having internal circuitry to reduce test time through parallel test setup and parallel pass/fail result generation is disclosed herein in various embodiments. In one embodiment, a CAM device includes a mode register that may be programmed by a test controller or other host device to enable a test operating mode in which write data may be written in parallel to multiple CAM array blocks of the CAM device and in which pass/fail values are generated in parallel within each of the CAM array blocks in response to a single compare instruction. The pass/fail values for each of the CAM array blocks may then be output from the CAM device at the conclusion of the compare operation in place of or instead of search results generated during normal-mode operation. In one embodiment, at least two different test modes are supported: a mismatch test mode to support single-bit mismatch testing, and a match test mode to support row-match testing. Various alternative or additional test modes may be supported in other embodiments.

Overview of an Embodiment

Figure 1:
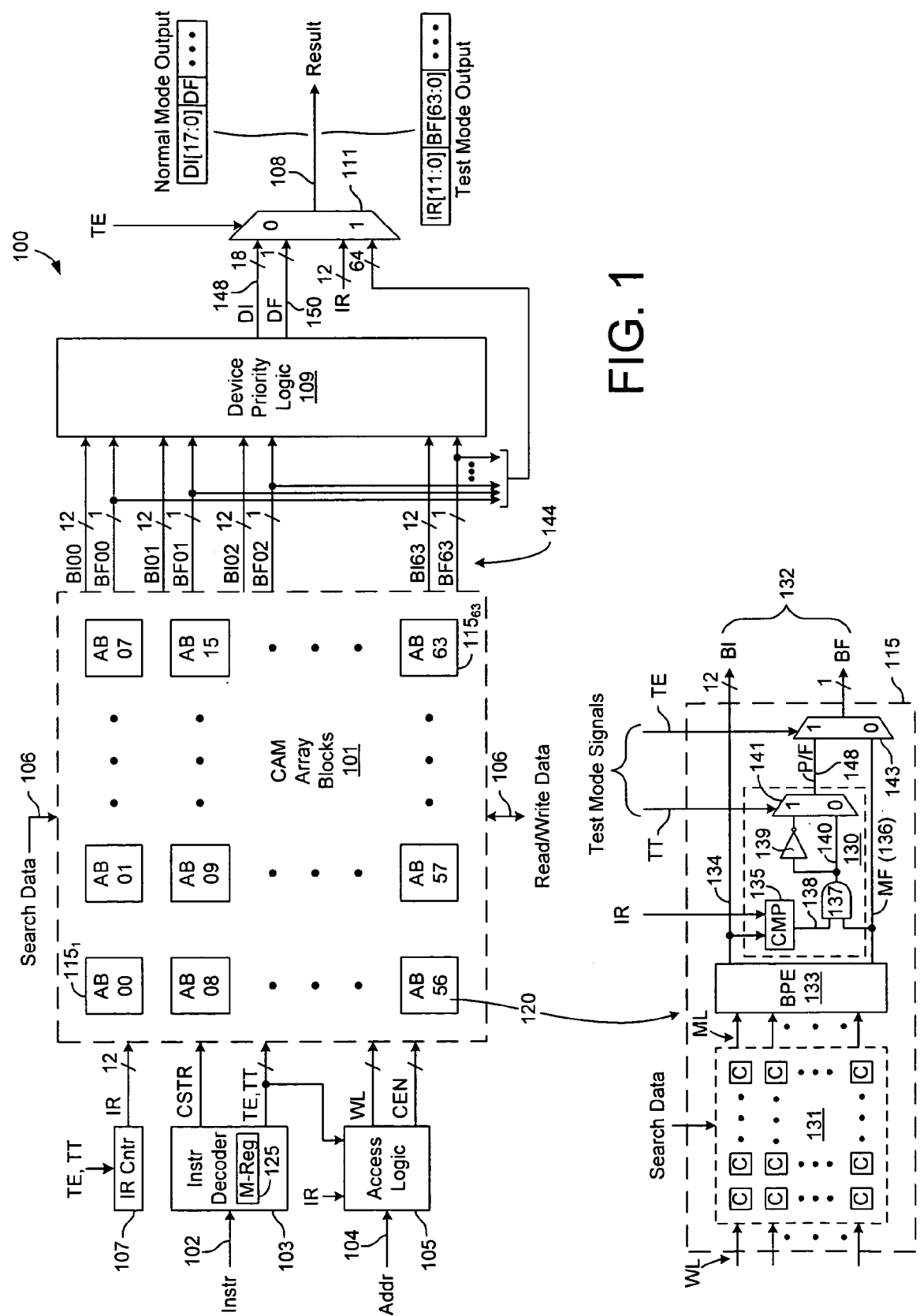
FIG. 1 illustrates an embodiment of a CAM device having circuitry to achieve reduced testing time through parallel testing.

FIG. 1 illustrates an embodiment of a CAM device 100 having circuitry to achieve reduced testing time through parallel testing. The CAM device 100 includes an instruction decoder 103, internal result counter 107, access logic 105, core array 101, device priority logic 109, and output selector 111. During run-time operation, the instruction decoder 103 receives instructions of various types from a host device (e.g., a network processor, general purpose processor or other control device) via instruction bus 102 and, in response, issues control and timing signals to the core array 101 and other circuit blocks as necessary to carry out the instructed operations. For example, when a compare instruction is received, the instruction decoder 103 issues a compare strobe signal (CSTR) and/or other signals to the core array 101 to enable compare operations (also referred to herein as search operations or lookup operations) therein, as well as signals to the device priority logic 109 to enable the device priority logic 109 to evaluate the comparison results. As another example, when a read or write instruction is received, the instruction decoder 103 responds by issuing control signals (not specifically shown in FIG. 1) to access logic 105 to enable the access logic 105 to form signal paths for conveying read and write data between an external data bus 106 and an address-specified storage location within the core array 101. As discussed below, the address used to access the core array 101 may be supplied via address bus 104 by the host device, or may be selected from one or more internal address sources. The instruction decoder 103 may similarly issue control/timing signals to other circuit blocks not specifically shown in FIG. 1, including for example and without limitation, global masking circuitry, error checking circuitry and so forth.

In the embodiment of FIG. 1, the core array 101 includes a set of sixty-four CAM array blocks $115_0$–$115_{63}$ (AB00–AB63), each having 4096 rows of CAM cells, though more or fewer CAM array blocks 115 (also referred to herein as CAM blocks or array blocks) may be provided in alternative embodiments and the CAM array blocks 115 or any subset thereof may include more or fewer rows of CAM cells. Each of the array blocks 115 is coupled to receive search data (also referred to herein as a search key or comparand) from the data bus 106 or from a dedicated comparand bus. In one embodiment, a shared comparand logic is provided to store the incoming search data before it is provided to the array blocks and may provide for reordering, filtering and/or compacting of bits or bit groups within the search data before forwarding the search data to the array blocks 115. Also, the same search data may be provided to all the array blocks 115 or different search data may be provided to respective array blocks 115 or groups of array blocks 115 according to application needs and the CAM device configuration.

In one embodiment, shown in detail view 120, each of the array blocks 115 includes an array of CAM cells 131 in which rows of CAM cells are used to store respective data words and in which columns of CAM cells are coupled to receive respective bits of a search data value. More specifically, each row of CAM cells is coupled to a respective word line (WL) and to a respective match line (ML), and each column of CAM cells is coupled to a pair of compare lines (not shown in FIG. 1) to receive a respective bit of a search data word. Each column of CAM cells may additionally be coupled to one or more pairs of bit lines (also not shown in FIG. 1) to enable read and write access to an address-selected row of CAM cells (i.e., selected by decoding the address to activate a word line) without interrupting search operations within the CAM array. Alternatively, the compare lines may be used to convey read and write data during read and write operations directed to the array block 115.

Still referring to detail view 120, each CAM cell (C) includes one or more storage elements and one or more compare circuits. In one embodiment, for example, each of the CAM cells is a binary CAM cell having a single storage element (e.g., a dynamic memory element such as a capacitive storage cell, a static memory element such as a latch or flip-flop, or any number of non-volatile storage cells) and a compare circuit to compare the value in the storage element with a search bit conveyed on the compare lines (e.g., in complementary signals) coupled to the CAM cell. Alternatively, the CAM cell may be a ternary CAM cell or quaternary CAM cell and thus have an additional storage element to store masking information (e.g., a mask bit) for selectively masking the result of the comparison operation (or disabling the comparison operation) within the CAM cell. For example, in a ternary CAM cell having a data storage element and a mask storage element, the following truth table may apply ('X' indicating a don't care state):

TABLE 1

| Search Bit | Data Bit | Mask Bit | Comparison Result |
|---|---|---|---|
| 0 | 0 | 0 | Match |
| 0 | 1 | 0 | Mismatch |
| 1 | 0 | 0 | Mismatch |
| 1 | 1 | 0 | Match |
| X | X | 1 | Match |

Alternatively, in a quaternary CAM cell in which the two storage elements are used to store an X-Y bit-pair generated by encoding a mask and data value, the following truth table may apply:

TABLE 2

| Search Bit | Y-Bit | X-Bit | Comparison Result |
|---|---|---|---|
| 0 | 1 | 0 | Match |
| 0 | 0 | 1 | Mismatch |
| 1 | 1 | 0 | Mismatch |
| 1 | 0 | 1 | Match |
| X | 0 | 0 | Match |
| X | 1 | 1 | Mismatch |

Other types of CAM cells may be used in alternative embodiments, including CAM cells having more than two storage elements and/or more than a single compare circuit per cell.

In one embodiment, each of the CAM cells in a given row is coupled to a pre-charged match line (ML) and thus may signal a mismatch condition by switchably coupling the match line to a ground reference node (e.g., switching on one or more transistors to form a path between the match line and ground reference node), thereby discharging the match line to a logic low state. By this arrangement, the match line for a given row remains pulled up to signal a match condition if the contents of the CAM cells coupled to the match line match the corresponding search bits (or are masked), and the match line is pulled down to signal a mismatch condition. This match signaling arrangement is assumed in the discussion below, though other arrangements for affecting the state of the match lines may be used in alternative embodiments.

In the embodiment of FIG. 1, the match lines (ML) are coupled to a block priority encoder 133 (BPE) which includes circuitry for latching the match results and generating a match address 134 that corresponds to a highest priority one of the rows of CAM cells for which the corresponding match line indicates a match detection. In one embodiment, the block priority encoder 133 prioritizes between competing match indications according to the physical location of the matching row (e.g., assigning a higher priority to rows having lower numbered addresses or alternatively, higher priority to rows having higher numbered addresses). In alternative embodiments, other prioritizing schemes may be used, including providing storage for priority numbers that correspond to each of the rows of CAM cells and thus enabling the relative priorities of the rows of CAM cells to be programmed. In either case, the match address 134 is output from the array block as a block index (BI).

The block priority encoder 133 additionally generates a match flag 136 (MF) that indicates whether a match has been detected within the CAM array 131 (e.g., by logically ORing the match signals conveyed on the match lines, ML). The match flag 136 is supplied to an output multiplexer 143 of the array block 115 and, in normal operating mode (i.e., when a test-enable signal (TE) is deasserted), is selected by multiplexer 143 to be output from the array block as a block flag signal (BF). Thus, during a search operation within the array core 101, each of the array blocks $115_0$–$115_{63}$ generates a respective block index (BI00–BI63) and block flag (BF00–BF63), collectively referred to herein as the block match results 144. In the particular embodiment shown, each of the block indices is a twelve bit value that is qualified (i.e., indicated to be valid or invalid) by a corresponding block flag. The block indices and block flags are supplied to the device priority logic 109 which performs a device-level priority-encoding function based on the block flags and the relative priorities (fixed according to physical location or address or programmable) of the array blocks 115 to generate a device index 148 (DI) and a device flag 150 (DF). In one implementation, for example, the device index 148 is an 18-bit value that includes a 6-bit block address that corresponds to the highest priority array block 115 having an asserted block flag, and the 12-bit block index from the highest priority array block. The device flag 150 may be generated, for example, as a logical OR combination of the block flags.

The device index 148 and device flag 150 are supplied to a first input port of the output selector 111 which, in normal operating mode (i.e., test-enable signal (TE) low), selects the device index 148 and device flag 150 to be output from the CAM device 100 onto result bus 108 as the search result. As indicated by the ellipsis in the exemplary representation of the normal-mode output in FIG. 1, various other information may be output along with the device index and device flag including, for example and without limitation, error-checking information that indicates whether a parity error or other data error has been detected at the storage location indicated by the device index, status information indicating whether multiple matches have been detected in the search and so forth.

Test Mode Operation

In one embodiment, the CAM device 100 includes a mode register 125 (M-Reg) that may be programmed to enable various test operating modes. Though depicted as being part of the instruction decoder 103, the mode register 125 may be disposed elsewhere within the CAM device 100 in alternative embodiments. Also, the mode register 125 may form part of a larger configuration circuit (e.g., a larger configuration register or set of configuration registers that includes the mode register) that may itself include storage elements to store information indicative of various configurations of the CAM device (e.g., logical width/depth dimensions of the array blocks or any subset or combination thereof, logical allocations of the array blocks for storage of data words of a particular type to enable storage of multiple simultaneously searchable databases; prioritizing policy within or between array blocks; error checking and/or correction policy; search data reordering, filtering and/or compacting information and so forth).

In one embodiment, when a test operating mode is selected, the instruction decoder 103 outputs one or more test mode signals, including the aforementioned test-enable signal (TE) and one or more test-type signals (TT), to the access logic 105, output selector 111, and core array 101 to establish a desired test-mode operation therein. In one embodiment, the access logic 105 responds to the to test-enable signal by enabling data to be written to each of the array blocks in parallel, in effect ignoring any array block address designation supplied with the write data. As discussed below, such parallel-write operation enables the array blocks to be loaded with background data and test data patterns in parallel, thus reducing by a factor of M (i.e., the number of array blocks) the number of write operations required to establish a desired test data state in the CAM device.

Within the core array 101, the test-enable and test-type signals are supplied to each of the array blocks to enable generation of pass/fail signals therein. More specifically, as shown in detail view 120, the test-type signal (TT) is supplied to a test logic circuit 130 within each array block to enable generation of a pass/fail signal 148, and the test-enable signal (TE) is supplied to the output multiplexer 143 of each array block 115. In one embodiment, the test-type signal selects between a mismatch test mode and match test mode within the test logic circuit 130 of each array block 115 so that, when a compare operation is carried out in the test mode (i.e., a test-mode compare), the test logic circuit generates a pass/fail signal according to the test type (i.e., according to whether a match or mismatch is the expected result of the compare operation) and the output multiplexer 143 selects the pass/fail signal to be output from the array block as the block flag (BF). In the embodiment of FIG. 1, the block flags from all the array blocks are supplied to second output port of output selector 111 and, in the test mode, output from the CAM device 100 along with the internal result value (IR). As shown, the test mode output data may additionally include other status information and is output from the CAM device in place of the normal-mode output data. In an alternative embodiment, the test mode output data may be output in addition to the normal-mode output data, for example, in a sequence of transfers over the result bus 108.

Returning to detail view 120, in one embodiment, the test-type signal (TT) is supplied to multiplexer 141 within the test logic circuit 130 of each array block 115 to select either a match-test result signal or a mismatch test result signal to be output as the pass/fail signal 148. More specifically, when the test-type signal specifies a mismatch test, a low match indication is expected for the row under test so that the mismatch test is deemed to be passed if either (i) the match flag 136 is low or (ii) the match flag 136 is high, but the block index 134 indicates a storage row other than the row under test. In one embodiment, the storage rows are tested in order from highest priority to lowest priority with each tested row left in a state confirmed to yield a mismatch, thus ensuring that any match signaled during mismatch testing should come from the row under test or from a row having a lower priority than the row under test. Accordingly, by incrementing the internal result counter as necessary to maintain an internal result value (IR) that corresponds to the row under test, and then comparing, in comparator 135, the block index 134 generated in a given mismatch-test compare operation with the internal result value, the resulting comparison signal 138 will be high if the highest priority match occurred in the row under test and low if no match was detected (assuming the block index does not match IR by happenstance) or if a match was detected in a lower priority row (i.e., a yet-to-be tested row). Accordingly, by ANDing the comparison signal 138 with the match flag 136 in logic AND gate 137, a test result signal 140 having a logic-high fail state and a logic-low pass state (i.e., 1=Fail, 0=Pass) is generated. In one embodiment, the logic-high fail state/logic-low pass state of signal 140 corresponds to the desired output state of the pass/fail signal, so that, when the mismatch test type is selected (e.g., TT=0), a non-inverted version of signal 140 is passed by multiplexer 141 to the test input port of output multiplexer 143 and, when the test mode is enabled (TE=1), output as the block flag (BF) for the array block 115.

Still referring to FIG. 1 and detail view 120, when the test-type signal specifies a match testing mode (i.e., TT=1 in this example), the pass/fail signal 148 should have a pass state (e.g., '0') if the contents of the row under test matches the search data supplied in a compare operation. Thus, the match test is deemed passed if the comparison signal 138 indicates that the internal result value matches the block index 134 (i.e., block index corresponds to the row under test) and the match flag 136 is asserted. Otherwise, if the match flag 136 is deasserted (i.e., no match detected) or the comparison signal 138 is low (i.e., block index 134 does not correspond to the storage row under test) then output of logic AND gate 137 will go low to indicate a test failure. Accordingly, an inverted version of signal 140 (i.e., having a logic high fail state and a logic low pass state) generated by inverter 139 is output by multiplexer 141 as the pass/fail signal 148 in response to the logic-high test-type signal and, when the test-enable signal is asserted, output from the array block 115 as the block flag.

Figure 3:
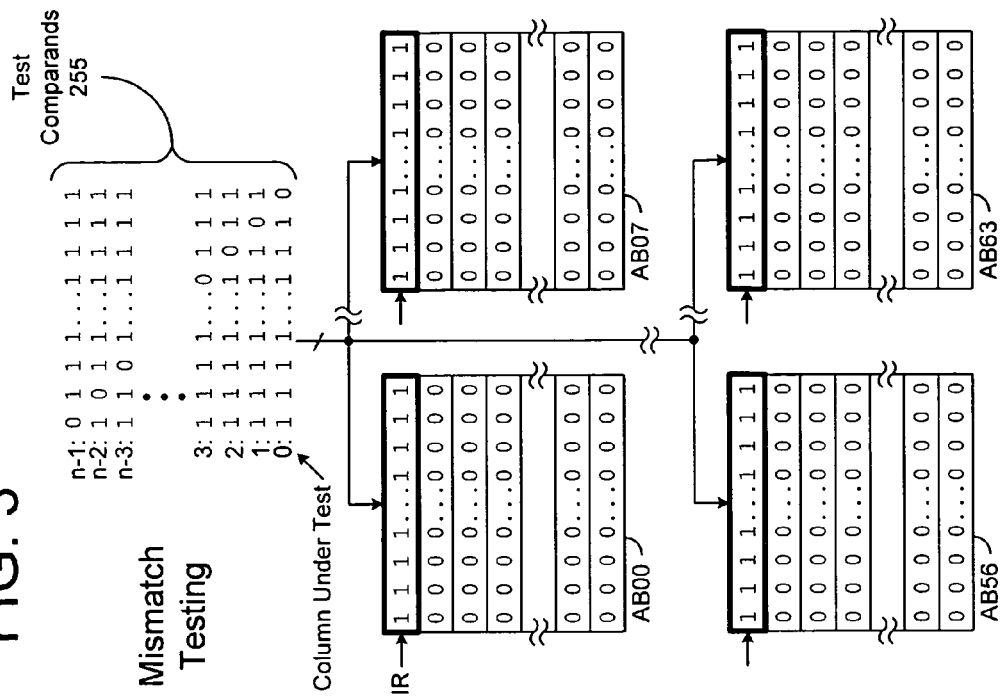
FIGS. 2 and 3 illustrate exemplary mismatch testing that may be performed in parallel within the array blocks of the CAM device of FIG. 1.
Figure 2:
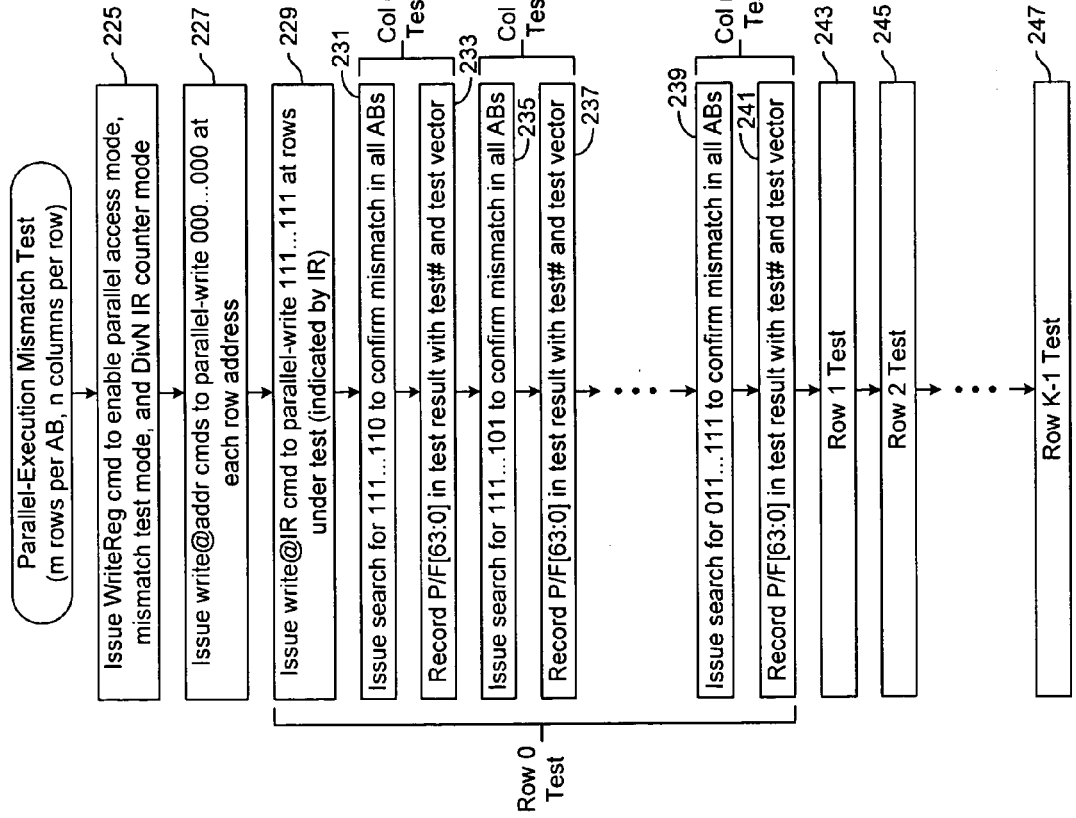
Figure 4:
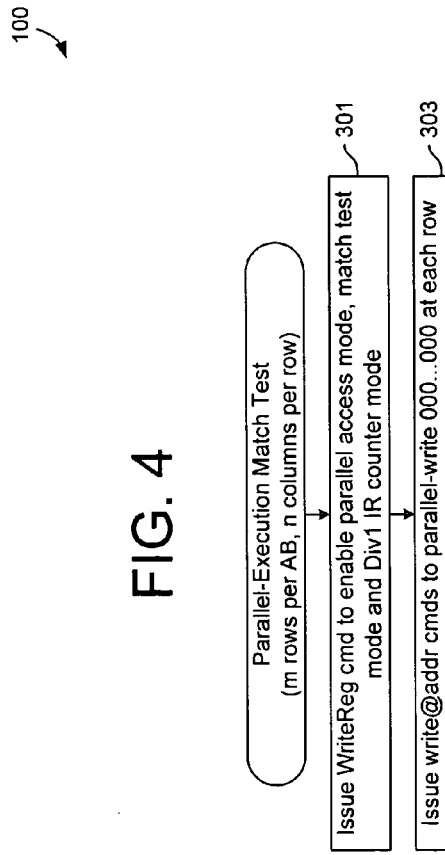
FIG. 4 illustrates exemplary match testing that may be performed in parallel within the array blocks of the CAM device of FIG. 1.

FIGS. 2, 3 and 4 illustrate examples of parallel mismatch and match tests that may be performed within the CAM device of FIG. 1 in response to a sequence of instructions from a host device or in response to a sequence of test vectors (i.e., a sequence of signals that emulate the output of a host device and that are generated in response to a test program) from a test controller. Referring first to FIGS. 2 and 3, which illustrate an exemplary mismatch test, a test controller (or host device) initially issues a write register command to the CAM device at 225 to program a test mode value into the mode register that enables a parallel-access mode within the access logic and mismatch test mode within the individual array blocks, and that establishes a divide-by-N operation of the internal result counter, N being the number of columns of CAM cells within an array block (i.e., array block width). In one embodiment, the internal result counter is reset to a value (e.g., zero) that corresponds to a highest priority row address within the core array when test mode is entered, thus establishing the highest priority row within each array block as the initial row under test in that array block. At 227, the test controller issues a sequence of write-at-address commands (write@addr) to write a zero-valued data word ('000 . . . 000') into each storage row of each of the array blocks; an operation referred to herein as a background data write. Because parallel access has been enabled within the CAM device, the background write operation may be completed in K write operations, where K is the number of storage rows per array block, instead of the M×K write operations that would be required in normal operating mode (M being the number of array blocks in the core array). Note that the sequence of write-at-address commands may include address values that specify the sequence of row addresses to be written (0 to K−1) or may specify an address counter (or the internal result counter) within the CAM device to source the address values, the counter being incremented from 0 to K−1 in the sequence of write operations. At 229, the test controller issues a write@IR command to store an all −'1's data word (i.e., 111 . . . 111) in parallel into the row under test of each array block of the core array. At this point, the core array is loaded with data as shown in FIG. 3, with the internal result counter specifying row zero of each of the array blocks as the row under test.

Returning to FIG. 2, at 231, the test controller issues an instruction to compare the contents of each array block with search data '111 . . . 110', thus initiating a single-bit mismatch test in parallel in column zero of each of the rows under test. That is, the search data matches the contents of the row under test at all bit positions except the column-zero bit position and therefore should yield a mismatch indication in the row under test within each of the array blocks. Thus, referring to the test logic circuit 130 shown in detail view 120 of FIG. 1, the block priority encoder 133 of each array block 115 should, absent failure in the row under test, yield a logic '0' match flag 136 (i.e., because none of the storage rows should match the search data) or, in the event that a match is erroneously detected in a row other than the row under test, should yield a logic '1' match flag 136 and a logic '0' comparison signal 138 (i.e., because the block index 134 will correspond to a lower priority row than the row under test). In either case, a logic '0' pass/fail signal 148 is output from the array block 115 as the block flag absent failure in the row under test. And, because the pass/fail results from each of the array blocks 115 is multiplexed onto the result bus 108 when the test mode is enabled, at 233 of FIG. 2, the test controller will receive the pass/fail results for each of the 63 array blocks (e.g., in parallel or in a sequence of transfers over the result bus 108) and therefore may record the test results along with a test number and test vector in a test record structure (e.g., a database, listing, printout or other record of the test results). At 235 and 237, the test-mode compare and result recordation operations of 231 and 233 are repeated but with the logic '0' bit in the search data shifted to the adjacent bit position, thus effecting a single-bit mismatch test in the same set of storage rows (i.e., row zero of each array block) but at a different column offset (i.e., walking the '0' across the bit positions within the search data). Thus, the operations 231 and 233 complete a single-bit mismatch test at column 0 of the row under test in each of the array blocks, the operations 235 and 237 complete a single-bit mismatch test at column 1 of the row under test in each of the array blocks, and so forth to operations 239 and 241 which effect a single-bit mismatch test at column N−1 of the row under test in each of the array blocks, where N is the number of columns in the storage row under test. The sequence of search values applied in column tests 0 to N−1 are shown as test comparands 255 in FIG. 3. After the Nth column test (i.e., single-bit mismatch test in column N−1), the internal result counter is incremented to point to the next storage row in each of the array blocks, and the sequence of operations 231–241 applied to test the columns of row zero are repeated for the new value of the IR counter, thus effecting a parallel mismatch test in each column of row 1 of each of the array blocks. Thus, after (or as part of) the final column test in each row under test, the internal result counter is incremented and the sequence of single-bit mismatch tests is repeated in the next row as at 243, 245, etc. This testing operation is repeated until the final row is tested in the row K−1 test shown at 247. Thereafter, the sequence of operations from 227–247 may be repeated with complement data (e.g., background writing '111 . . . 111' throughout the array core, loading the rows under test with '000 . . . 000' and then comparing with search values '000 . . . 001', '000 . . . 010', . . . , '100 . . . 000' in a sequence of column tests). Though not specifically shown, an all-bits clear data value, '000 . . . 000' may be written to each row under test at the conclusion of single-bit mismatch testing therein to prevent a single-bit mismatch failure in the tested row (i.e., a match indication) from masking test results in lower priority rows.

Reflecting on the single-bit mismatch testing of FIG. 2, it can be seen that the test logic circuitry provided within each of the array blocks to generate the collection of pass/fail values output via the result bus during each compare cycle enables the single-bit mismatch testing to be completed in parallel for each of the array blocks, thus reducing the overall test time by a factor, M, that corresponds to the number of array blocks. For example, in a CAM device having a 64 megabit (Mb) core array organized in 64 one-Mb array blocks, and a 3 million search per second (3 MS/s) search rate, the test time for single-bit mismatch testing with both logic '1' and logic '0' test data may be reduced from approximately 42 seconds to less than a second. Other CAM densities, core array organizations and search rates may apply in alternative embodiments.

FIG. 4 illustrates an example of a parallel match test that may be carried out within the CAM device 100 of FIG. 1. At 301, a test controller or host device issues a write register command to the CAM device to program a test mode value into the mode register that enables the parallel-access mode within the access logic and match test mode (i.e., TE=TT=1) within the individual array blocks, and that establishes a divide-by-unity (i.e., no division) operation of the internal result counter so that the internal result value is incremented after each search operation within the CAM device. As discussed above, the internal result counter may be reset to a value that corresponds to a highest priority row address within the core array (zero in this example) upon entering test mode, thus establishing the highest priority row within each array block as a row under test. At 303, the test controller issues a sequence of write commands to carryout a background data write with zero-valued data, '000 . . . 000'. At 305, the test controller issues writemask-at-address commands to store, in parallel within each array block, mask words '111 . . . 111' into the local mask storage of each row of CAM cells, thus effecting a background mask write to mask the data value stored in each CAM row. As with the background data write, the parallel access mode reduces the number of write cycles required to complete the background mask write by a factor M that corresponds to the number of array blocks written in parallel.

At 307, the test controller issues an instruction to the CAM device to search for data pattern '111 . . . 111' to confirm a match detection at row 0 within all the array blocks. That is, because all the array entries are masked, match signals should be asserted for each row of each array block and, in an implementation in which match indications at lower numbered addresses are given priority over those at higher numbered row addresses, the block priority encoder within each array block should generate a block index that corresponds to row zero (note that the background write at 303 is optional as the expected match result should be obtained regardless of the data stored within the tested storage rows). Thus, referring to detail view 120 of FIG. 1, in a successful match test at row zero, the block index 134 should be zero and thus match the internal result value, IR. As a result, the comparison signal 138 and match flag 136 will both be high and thus yield a logic '1' output at the logic AND gate 137 (i.e., signal 140 is high) which is inverted by inverter 139 to provide a pass/fail signal having the desired logic state (pass=0, fail=1). Because the test-type signal and test-enable signal are both high, the pass/fail signal 141 from inverter 139 is passed via multiplexers 141 and 143 to the output of the array block 115 as the block flag. Because a 'x1' counting mode has been selected for the internal result counter, the internal result counter is incremented after each match test (e.g., on a falling edge of the compare strobe signal or derivative thereof) and therefore points to the subsequent row. To prevent a higher priority row from producing a match indication during a test in a lower priority row, the test controller may issue an invalidate command as shown at 309 to invalidate, in parallel, the row at location IR−1 (which may be a write-at-address command to write an invalidity bit at each row following a match test therein) within each of the array blocks. Through these operations, the match flag 136 should be asserted and the block index 134 generated during each match-test compare operation should match the internal result value, IR. Accordingly, a logic '1' pass/fail signal 148 is output as the block flag to indicate a match test failure if no match is detected (match flag 136 low) or if the output of comparator 135 is low (block index 134 not equal to internal result count), and logic '0' pass/fail value is output to indicate match test success otherwise.

Returning to FIG. 4, at 311 the pass/fail vector (i.e., pass/fail results from each of the array blocks) is received in the test controller via the result bus and recorded along with the test number and test vector, thus concluding the test at row 0. Note that this operation may be performed prior to or concurrently with the invalidation operation at 309. In any case, the operations 307, 309 and 311 are repeated for each subsequent storage row to effect parallel match tests in rows 1 to K−1 as shown at operations 315, 317, 319 and 321, 323, 325.

Figure 5:
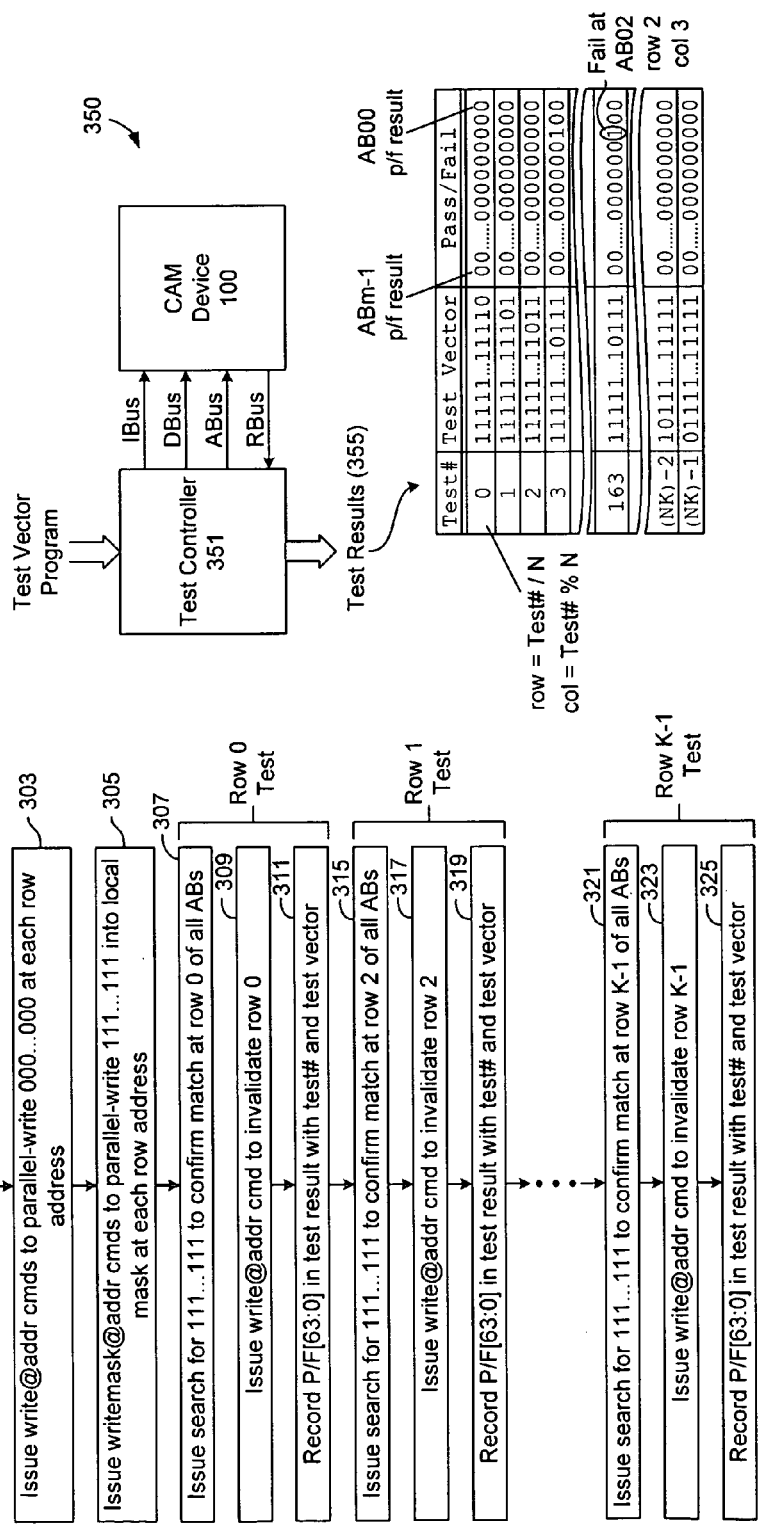
FIG. 5 illustrates an embodiment of a test system including a test controller and CAM device that are coupled to one another via instruction, data, address and result buses as generally described in reference to FIG. 1.

FIG. 5 illustrates an embodiment of a test system 350 including a test controller 351 and CAM device 100 that are coupled to one another via instruction, data, address and result buses as generally described in reference to FIG. 1. In alternative embodiments, any one or more of the instruction, data, address and result buses may be omitted and the signals otherwise conveyed thereon instead conveyed on one or more of the remaining buses. The test controller 351 may be a laboratory or production-time test device such as a logic analyzer, automated test equipment (ATE) or any other device that may be coupled to the bus interface nodes of the CAM device 100 and capable of delivering desired test vectors (i.e., patterns of signals) thereto and receiving results therefrom. In one embodiment, for example, the test controller 351 may be a wafer-level test controller having probes to contact bond pads or other input/output structures within the CAM device 100 while the device remains in uncut form along with other CAM devices on a wafer (i.e., uncut die). Alternatively, the test controller 351 may be used to test the CAM device 100 at any later point in the device manufacturing sequence (i.e., after wafer cut but before die packaging, after packaging, etc.). In other embodiments, the test controller 351 may be used to test the CAM device 100 after it has been coupled in circuit to one or more other components. For example, the test controller 351 may be coupled to a test-access port of the CAM device 100 to enable entry of test vectors and recovery of test results through boundary-scan techniques. The test controller 351 may also be implemented by a component included in a finished system, printed circuit board, integrated circuit package or die that includes the CAM device 100. For example, in one embodiment, the test controller may be implemented by a programmed processor (e.g., NPU, general purpose processor) or other controller that is used, during normal system operation, to issue search instructions and database maintenance instructions to the CAM device 100, thus providing a system-level built-in-self-test (BIST) capability. Alternatively, the test controller 351 may be included on the same integrated circuit die (or package) as the CAM device 100 so that the die or package that includes the CAM device 100 supports a die or package-level BIST capability. In any case, the test controller 351 responds to a test vector program (e.g., recorded in a storage device coupled to or available to the test controller) by generating a sequence of test vectors as necessary to carry out the parallel match and parallel mismatch tests described in reference to FIGS. 2–4 and thus obtain a record of test results. In the particular example of FIG. 5, an exemplary list of test results 355 achieved through execution of the mismatch test of FIGS. 2 and 3 is shown, including a sequence of test numbers (Test#) that correspond to the sequence of search instructions issued as part of the mismatch test (the numbers may correspond to each test vector and thus include test numbers that correspond to setup instructions such as background write operations and loading of test data into the row under test), the test vector output to effect each search instruction, and the pass/fail result obtained for each of the array blocks. In the particular example shown, the test numbers are assumed to correspond to the sequence of search instructions so that the row under test may be obtained by integer division of the test number by the number of columns tested per row (i.e., Test#÷N) and the column under test obtained as the remainder of the integer division (i.e., Test# % N, where '%' denotes a modulus operation). Thus, in the case of a mismatch test result in a CAM device having 80-bit storage rows (wider or narrower storage rows may alternatively be used), the logic '1' pass/fail result in array-block bit position 2 of test number 163 indicates that a single-bit mismatch test failure was detected at row 2 (int[163/80]=2), column 3 (163%80=3) of array block 2 (AB02). In alterative embodiments, the test numbers may correspond to all test vectors output by the test controller so that some test numbers correspond to setup vectors such as those output to effect background write operations loading of test data into the row under test. In such cases, a deterministic relationship between Test# and the row and column under test still exists so that that the row and column under test may be determined from the test number.

Figure 6:
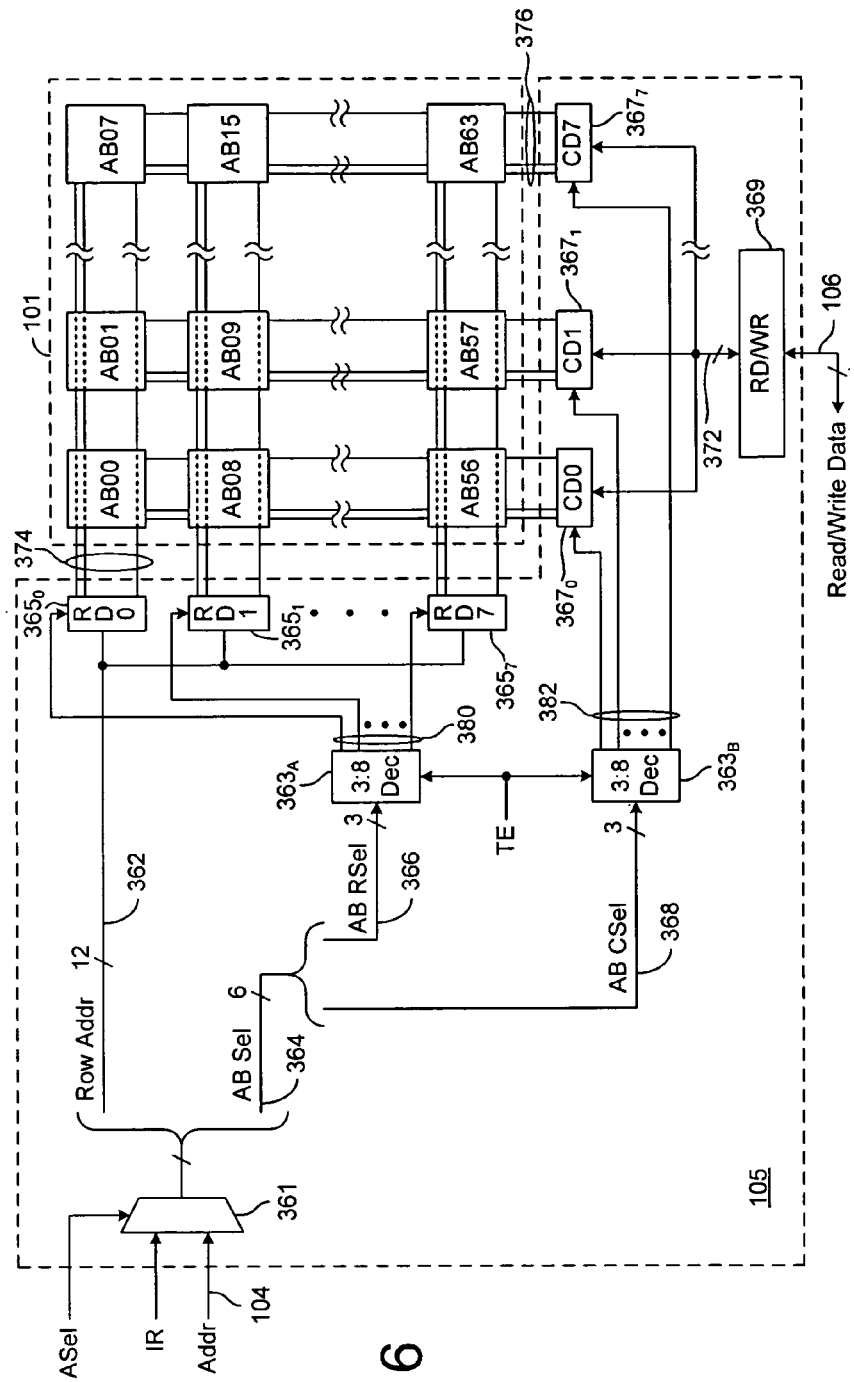
FIG. 6 illustrates an exemplary embodiment of the access logic of FIG. 1 and its interconnection to the core array.

FIG. 6 illustrates an exemplary embodiment of the access logic 105 of FIG. 1 and its interconnection to the core array 101. The access logic 105 includes an address selector 361, array-block decoders $363_A$ and $363_B$, row decoders $365_0$–$365_7$, column decoders $367_0$–$367_7$ and read/write circuit 369. The address selector 361 is provided to select an address from a source indicated by an address-select signal, ASel, the address-select signal being output from the instruction decoder in response to a read or write instruction from the host device. Referring to FIG. 1, the selectable address sources include address bus 104 and internal result counter 107, as well as a number of other circuit blocks including, without limitation, the device priority logic 109 (e.g., to enable access to the storage location that yielded a device index during a search operation or a next-free-address generated during a write operation or search operation), an error address register (not shown) that generates a predetermined sequence of addresses at which error checking operations are to be performed, an address counter (also not shown) to enable an initial address value to be incremented or decremented for background writing purposes or for database loading, and so forth.

In the normal operating mode (i.e., test-enable signal deasserted), each address passed by the address selector 361 includes array-block address 364 and row address 362 components that correspond to a unique array block and storage row within the array block. In the particular embodiment shown in FIG. 2, the array-block address 364 is a six-bit value that enables access to one of the sixty-four array blocks, and the row address 362 is a twelve-bit value that specifies one of 4096 rows of CAM cells (i.e., CAM rows or storage rows) within the selected array block. The array-block address 364 and/or row address 362 may include more or fewer bits in alternative embodiments according to the number of array blocks in the core array 101 and storage rows per array block. The array-block address 364 itself includes a block-row selector 366 and a block-column selector 368 that are supplied to array-block decoders $363_A$ and $363_B$, respectively. In the normal operating mode, the array-block selector $363_A$ decodes the block-row selector 366 (i.e., in a 3:8 decode operation) to assert one of eight row-decode enable signals 380, and array-block selector $363_B$ similarly decodes the block-column selector 368 to assert one of eight column-decode enable signals 382. The row-decode enable signals 380 are supplied to respective row decoders $365_0$–$365_7$, and the column-decode enable signals 382 are likewise supplied to respective column decoders $367_0$–$367_7$. Each of the row decoders 365 is coupled to receive the row address component 362 of the selected address and, when enabled by assertion of the corresponding one of the row-decode enable signals 380, decodes the row-address 362 to activate one of the 4096 word lines 374 coupled to the corresponding row of array blocks. Each of the column decoders 367 is coupled between a respective set of bit lines 376 that extend through a corresponding column of array blocks (and are coupled to the columns of CAM cells therein) and input/output (I/O) lines 372 of the read/write circuit 369. In one embodiment, each of the column decoders 367 includes transistors coupled in a pass-gate configuration (e.g., source to drain) between the I/O lines 372 and the bit lines 376 of the corresponding column of array blocks, with gate terminals of the pass-gate transistors coupled in common to the corresponding column-decode enable signal 367. Thus, when one of the column-decode enable signals 367 is asserted, the pass-gate transistors are switched to a conducting state to form a conductive path between the I/O lines 372 and bit lines 376 of the corresponding array block column. In an alternative embodiment, separate dedicated read/write circuits may be provided for each array block and selectively enabled by the row/column decoders 363 (which may be a unified 6:64 decoder). In such an embodiment, a distinct set of word lines 374 and a distinct set of bit lines 376 may be provided for each array block.

In one embodiment, the test-enable signal (TE) is supplied to the array-block decoders $363_A$ and $363_B$ to enable a parallel access operation within the access logic. More specifically, when the test-enable signal is asserted (i.e., test mode enabled), array-block decoder $363_A$ asserts all the row-decode enable signals 380 and array-block decoder 363B asserts all the column-decode enable signals 382, thus enabling parallel access into an address-selected storage row within each of the array blocks. That is, each of the row decoders $365_0$–$365_7$ activates a word line (i.e., one of lines 374) that corresponds to the incoming row address, and each of the column decoders 367 couples the I/O lines 372 of read/write circuit 369 to the bit lines 376 of the corresponding column of array blocks, thus enabling a data value supplied via bus 106 to be simultaneously written to each of the array blocks of the core array 101. By this operation, the total number of write operations, and therefore the total time, required to store background data and test data patterns within the core array 101 during device testing may be reduced by a factor of M, where M is the number of array blocks in the core array. In one embodiment, write driver circuits within the read/write driver 369 may also be coupled to receive the test-enable signal to provide for mode-specific control over write driver strength. By this arrangement, the drive strength of the write driver circuits may boosted when parallel access to the array blocks is enabled (thus providing the additional drive strength needed to achieve multi-block write) and returned to a single-block write level when the parallel access is disabled. Note that the array-block address 364 is unused when parallel access is enabled within the access logic so that, for example, the address signal lines used to convey the array-block address may be used to transport other types of signals to or from the CAM device when test mode is enabled.

Figure 7:
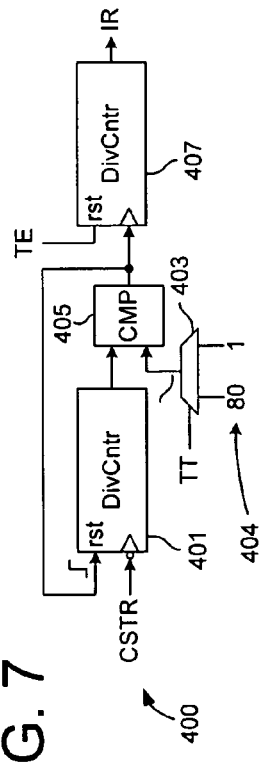
FIG. 7 illustrates an embodiment of a programmable-increment event counter that may be used to implement the internal result counter described in reference to FIGS. 1 and 2–4.

FIG. 7 illustrates an embodiment of a programmable-increment event counter 400 that may be used to implement the internal result counter 107 described in reference to FIGS. 1 and 2–4. The event counter 400 includes a first-stage counter 401 (DivCntr), comparator 405, second stage counter 407 and increment selector 403. The first-stage counter 401 has a strobe input coupled to detect falling edges in the compare strobe signal CSTR (or other control signal) and is thus incremented at the conclusion of each compare operation. The count value within the first-stage counter 401 is supplied to a comparator 405 for comparison with one of increment values 404 selected by increment-selector 403. When the first-stage counter value 401 matches the selected increment value, the output of comparator 405 transitions from low to high to increment the internal result value within the second stage counter 407 and to reset the count value within the first-stage counter 401. By this arrangement, the internal result value 407 is incremented once per completion of a number of compare operations equal to the selected increment value. In one embodiment, the second stage counter 407 is a modulo counter that overflows or underflows to a predetermined starting value (e.g., rollover to zero) after reaching a count equal to the array-block depth configuration (i.e., logical or physical number of rows within the array blocks or any subset thereof). In the particular embodiment shown, the increment selector 403 includes two inputs to select, according to the test-type signal (TT), either a x80 or x1 increment value. For example, when the test-type signal indicates a mismatch test mode, the x80 increment value is supplied to the comparator 405 so that the internal result value is incremented after every 80 compare operations. When the test-type signal indicates a match test mode, the x1 increment value is supplied to the comparator 405 so that the internal result value is incremented after each compare operation. Other increment values may be selected by the increment selector in other embodiments and/or in response to other test modes. Also, the test-enable signal (TE) may be supplied to an edge-triggered reset input of the second stage counter (and/or the first stage counter 401) to reset the counter when the test mode is entered.

Still referring to FIG. 7, in alternative embodiments, numerous other types of counter circuits may be used to implement the internal result counter 400. Also, in embodiments in which a non-sequential row address sequence is desired, the internal result counter may be replaced by a host programmable register (e.g., written by the test controller during each test or set of tests), or pattern generating circuit. For example, in one embodiment, the internal result value is alternately incremented and decremented to produce a sequence of addresses that progress toward a center address from both ends of the address range (e.g., 0, K−1, 1, K−2, 2, K−3, . . . , (K/2)−1, (K/2)). More generally, while particular tests and sequences of IR values have been described, various other match tests, mismatch tests, mask tests, next-free-address tests, read/write tests and so forth, all or any of which may have corresponding IR value sequences, may be performed within the array blocks in parallel to reduce test time. Accordingly, the internal result counter may be more generally implemented by an expected-result circuit for generating or storing the result expected during a given test-mode compare operation.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. The term "exemplary" is used to express an example, not a preference or requirement.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. A method of operation within a content addressable memory (CAM) device, the method comprising:

generating a plurality of match results in a plurality of CAM blocks in response to a search instruction, each match result including a block flag signal that indicates whether a match was detected within a corresponding one of the CAM blocks and a block index that indicates a location of an entry within the one of the CAM blocks;

outputting the block index and block flag signal of a highest priority one of the match results from the CAM device if an operating mode value indicates a first operating mode; and outputting each of the block flag signals of the plurality of match results from the CAM device if the operating mode value indicates a test operating mode.

2. The method of claim 1 further comprising, prior to generating the plurality of match results, receiving an instruction to store the operating mode value in a mode register of the CAM device to enable either the first operating mode or the test operating mode.

3. The method of claim 1 further comprising:

comparing the block index generated within each of the plurality of CAM blocks with contents of an expected-result register to generate a comparison result; and generating the block flag signal within each of the plurality of CAM blocks in either a first state or a second state based, at least in part, on the comparison result generated within the CAM block.

4. The method of claim 1 further comprising outputting an inverted version of the block flag if the operating mode indicates a first test type and outputting a non-inverted version of the block flag if the operating mode indicates a second test type.

5. The method of claim 1 further comprising enabling a parallel write mode if the operating mode value indicates the test operating mode.

6. The method of claim 1 wherein outputting the plurality of block flags comprises outputting the plurality of block flags instead of outputting the highest priority one of the match results.

7. The method of claim 1 wherein outputting the plurality of block flags comprises outputting the plurality of block flags in addition to outputting the highest priority one of the match results.

8. A method of testing a content addressable memory (CAM) device having a plurality of CAM blocks, the method comprising:

outputting to the CAM device a register-write command to enable a parallel write mode and a test mode within the CAM device;

outputting to the CAM device a sequence of write commands directed to each row address of the CAM device to store desired data patterns, in parallel, within each of the CAM blocks;

outputting to the CAM device a compare command to compare a search value with the data patterns stored within each of the CAM blocks; and receiving from the CAM device a test result value that includes a plurality of block flag signals, each of the block flag signals indicating whether an expected match result was generated within a corresponding one of the CAM blocks in response to the compare command.

9. The method of claim 8 wherein outputting to the sequence of write commands comprises outputting a sequence of row address values.

10. The method of claim 8 further comprising repeating said outputting the compare command and said receiving the test result value at least once for each unique row address within the CAM device.

11. A content addressable memory (CAM) device comprising:

a plurality of CAM blocks to generate respective match results in response to a compare operation, each of the match results including a block flag component and a block index component; and encoding logic to identify the match result from one of the CAM blocks as a highest priority match result and to generate a block address that corresponds to the one of the CAM blocks; and an output selector circuit to select, according to the state of a test mode signal, either the highest priority match result or the block flag components of the match results to be output from the CAM device.

12. The CAM device of claim 11 further comprising a configuration circuit to store a mode control value that controls the state of the test mode signal.

13. The CAM device of claim 12 further comprising an instruction decoder to load the mode control value into the configuration circuit in response to a programming instruction from a host device.

14. The CAM device of claim 11 further comprising access circuitry to enable a write data value to be written to each of the plurality of CAM blocks in parallel when the test mode signal is in a first state.

15. The CAM device of claim 11 wherein the test mode signal comprises a plurality of component signals.

16. A content addressable memory (CAM) device comprising:

a first plurality of rows of CAM cells to generate corresponding first match signals, each of the first match signals indicating whether content within the corresponding row of CAM cells matches a search value;

a first priority encoder to assert a first match flag if one of the first match signals indicates a match and to generate a first match address that identifies the row of CAM cells that corresponds to the one of the first match signals;

an expected-result circuit to generate an expected match address;

first test circuitry to compare the first match address with the expected match address and to generate a first pass/fail value having either a first state or second state based, at least in part, on whether the first match address matches the expected match address; and a first multiplexer to output either the first pass/fail value or the first match flag according to the state of a test mode signal.

17. The CAM device of claim 16 further comprising:

a second plurality of rows of CAM cells to generate corresponding second match signals, each of the second match signals indicating whether content within the corresponding row of CAM cells matches the search value;

a second priority encoder to assert a second match flag if one of the second match signals indicates a match and to generate a second match address that identifies the row of CAM cells that corresponds to the one of the second match signals;

second test circuitry to compare the second match address with the expected match address and to generate a second pass/fail value having either the first state or second state based, at least in part, on whether the second match address matches the expected match address; and a second multiplexer to output either the second pass/fail value or the first match flag according to the state of a test mode signal.

18. The CAM device of claim 17 further comprising an output selector to output the first and second pass/fail values concurrently oh respective signal lines of an external signal path.

19. The CAM device of claim 16 wherein the first test circuitry comprises a comparator circuit to compare the first match address with the expected match address to generate a comparison signal, and a logic gate to logically combine the comparison signal with the first match flag to generate the first pass/fail value.

20. The CAM device of claim 19 further comprising an inverter to generate an inverted version of the first pass/fail value and a multiplexer to select either the output of the logic gate or the inverted version of the pass/fail value as a final pass/fail value to be output from the CAM device.

21. A test system comprising:
a test controller; and
a content addressable memory (CAM) device coupled to receive a search value from the test controller, the CAM device including:
 a first plurality of rows of CAM cells to generate corresponding first match signals, each of the first match signals indicating whether content within the corresponding row of CAM cells matches the search value;
 a first priority encoder to assert a first match flag if one of the first match signals indicates a match and to generate a first match address that identifies the row of CAM cells that corresponds to the one of the first match signals;
 an expected-result circuit to generate an expected match address;
 first test circuitry to compare the first match address with the expected match address and to generate a first pass/fail value having either a first state or second state based, at least in part, on whether the first match address matches the expected match address; and
 a first multiplexer to output either the first pass/fail value or the first match flag according to the state of a test mode signal.

22. Computer-readable media having information embodied therein that includes a description of a content addressable memory (CAM) device, the information including descriptions of:
a first plurality of rows of CAM cells to generate corresponding first match signals, each of the first match signals indicating whether content within the corresponding row of CAM cells matches a search value;
a first priority encoder to assert a first match flag if one of the first match signals indicates a match and to generate a first match address that identifies the row of CAM cells that corresponds to the one of the first match signals;
an expected-result circuit to generate an expected match address;
first test circuitry to compare the first match address with the expected match address and to generate a first pass/fail value having either a first state or second state based, at least in part, on whether the first match address matches the expected match address; and
a first multiplexer to output either the first pass/fail value or the first match flag according to the state of a test mode signal.

23. A content addressable memory (CAM) device comprising
a plurality of CAM blocks, each including an array of CAM cells;
means for generating a plurality of match results within the plurality of CAM blocks in response to a search instruction, each match result including a block flag signal that indicates whether a match was detected within a corresponding one of the CAM blocks and a block index that indicates a location of an entry within the one of the CAM blocks;
means for outputting the block index and block flag signal of a highest priority one of the match results from the CAM device if an operating mode value indicates a first operating mode; and
means for outputting each of the block flag signals of the plurality of match results from the CAM device if the operating mode value indicates a test operating mode.

* * * * *

UNITED STATES PATENT AND TRADEMARK OFFICE
CERTIFICATE OF CORRECTION

| | | |
|---|---|---|
| PATENT NO. | : 7,193,877 B1 | Page 1 of 1 |
| APPLICATION NO. | : 11/256066 | |
| DATED | : March 20, 2007 | |
| INVENTOR(S) | : Sadashiva R. Yelluru | |

It is certified that error appears in the above-identified patent and that said Letters Patent is hereby corrected as shown below:

Claim 18, Column 17, line 9, change "concurrently oh respective" to --concurrently on respective--

Signed and Sealed this

Twelfth Day of June, 2007

JON W. DUDAS
*Director of the United States Patent and Trademark Office*